United States Patent
Heiland, Jr. et al.

(10) Patent No.: US 9,459,300 B2
(45) Date of Patent: *Oct. 4, 2016

(54) INTERNAL LINE REPLACEABLE UNIT HIGH INTENSITY RADIATED FIELD DETECTOR

(71) Applicant: BAE Systems Controls Inc., Endicott, NY (US)

(72) Inventors: Paul Hart Heiland, Jr., Endicott, NY (US); Richard P. Quinlivan, Binghamton, NY (US); Thomas Edward Guth, Endicott, NY (US); Zain Adam Horning, Johnson City, NY (US); Peter Joseph Watson, Endicott, NY (US); Gustavo Enrique Melendez Velazquez, Endicott, NY (US)

(73) Assignee: BAE Systems Controls Inc., Endicott, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/627,891

(22) Filed: Feb. 20, 2015

(65) Prior Publication Data

US 2015/0160278 A1 Jun. 11, 2015

Related U.S. Application Data

(63) Continuation of application No. 13/455,777, filed on Apr. 25, 2012, now Pat. No. 8,994,391.

(51) Int. Cl.
*G01R 31/02* (2006.01)
*G01R 29/08* (2006.01)
(Continued)

(52) U.S. Cl.
CPC ....... *G01R 29/0835* (2013.01); *G01R 29/0864* (2013.01); *G01R 31/001* (2013.01); *G01R 31/04* (2013.01)

(58) Field of Classification Search
CPC .. G01R 31/02; G01R 29/08; G01R 31/3187; G01R 29/0864; G01R 29/0835
See application file for complete search history.

(56) References Cited

U.S. PATENT DOCUMENTS

| 721,823 | A | 3/1903 | McGarrity |
| 5,315,232 | A | 5/1994 | Stewart |

(Continued)

FOREIGN PATENT DOCUMENTS

| EP | 0693696 A3 | 1/1996 |
| JP | 2005301724 A | 10/2005 |

OTHER PUBLICATIONS

U.S. Office Action dated Jun. 27, 2014 of related U.S. Appl. No. 13/455,777.

*Primary Examiner* — Son Le
(74) *Attorney, Agent, or Firm* — Scully, Scott, Murphy & Presser, P.C.; Scott J. Asmus

(57) ABSTRACT

Various embodiments for detecting a high Intensity radiated field (HIRF) in a line replaceable unit are provided. For example, an internal detector includes at least one antenna attached to a chassis. The at least one antenna is configured and dimensioned to pick up an electromagnetic field. The electromagnetic field induces a current in the at least one antenna proportional to a magnitude of the electromagnetic field. The internal detector also includes a circuit configured to generate a DC signal based on the induced current in the at least one antenna and a processing section configured to compare the DC signal with a threshold and output a result of the comparison to a built-in test section. The internal detector may be used to test EMI filter pin connectors of a closed line replaceable unit.

15 Claims, 11 Drawing Sheets

(51) Int. Cl.
*G01R 31/00* (2006.01)
*G01R 31/04* (2006.01)

(56) References Cited

U.S. PATENT DOCUMENTS

| | | | |
|---|---|---|---|
| 5,600,307 A * | 2/1997 | Aslan | 340/600 |
| 5,928,300 A * | 7/1999 | Rogers et al. | 701/45 |
| 6,900,642 B2 | 5/2005 | Zank et al. | |
| 7,208,740 B2 | 4/2007 | El-Hanany et al. | |
| 7,283,934 B2 | 10/2007 | Deller et al. | |
| 7,551,086 B2 | 6/2009 | Coop et al. | |
| 7,619,422 B2 | 11/2009 | Tsamis et al. | |
| 7,760,084 B2 | 7/2010 | Jensen et al. | |
| 2005/0174100 A1 * | 8/2005 | Philips | 324/76.11 |
| 2005/0258842 A1 | 11/2005 | Maloney | |
| 2011/0006752 A1 | 1/2011 | Cohen | |

* cited by examiner

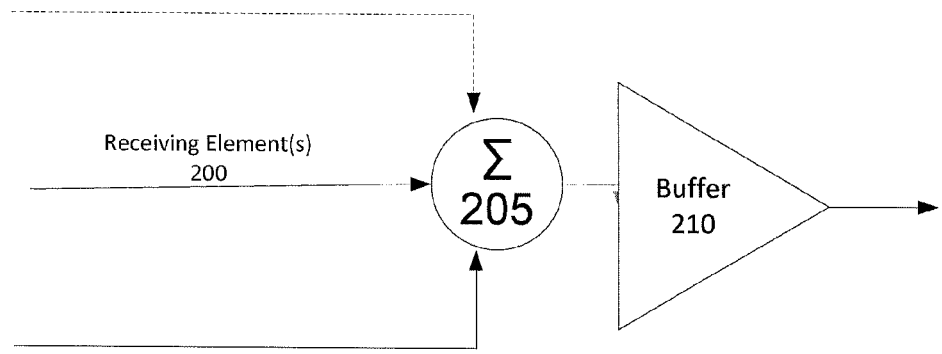
Figure 2A Receiving Section (105A)
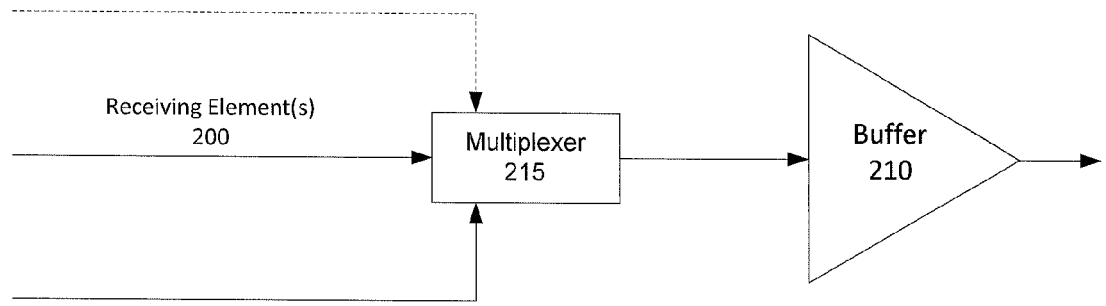
Figure 2B Receiving Section (105B)

INTERNAL LINE REPLACEABLE UNIT HIGH INTENSITY RADIATED FIELD DETECTOR

CROSS-REFERENCE TO RELATED APPLICATION

This application is a continuation of U.S. application Ser. No. 13/455,777, filed Apr. 25, 2012, the entire contents of which are incorporated herein by reference.

FIELD OF THE INVENTION

This invention relates to the detection of High Intensity Electromagnetic Fields (HIRF). More particularly, this invention relates to a detector for detecting HIRF in a line replaceable unit.

BACKGROUND

Line replaceable units (LRU) are used in commercial and military applications to provide a specific function. A line replaceable unit includes chassis and a plurality of electronic circuits. Some of the electronic components that form the electronic circuits may be sensitive to HIRF. At some level of HIRF intensity a circuit may malfunction causing the LRU to malfunction. A typical LRU has EMI protection such as EMI filter pins in the LRU connectors used to connect the LRU to external cabling and careful shielding of the chassis covers. These protection elements, however, can fail, resulting in the electronic components being subject to the HIRF.

LRUs are tested after assembly to verify that their operation meets specification in an Acceptance Test using factory Test Equipment. In a similar manner, LRUs that have failed and are repaired in the factory or in a test facility are tested to a similar specification using the factory Test Equipment or other test equipment that can accomplish the same testing. These tests are referred to as Continued Airworthiness tests in the case of equipment used on Civil Aircraft.

The testing is conducted on a closed box. That is; the unit is connected to test equipment using cabling similar to that in the vehicle with loads and inputs which simulate normal interfaces.

SUMMARY OF THE INVENTION

Accordingly, disclosed is a system, device and method for verifying the integrity of the EMI filter pin connectors or LRU shielding in a closed LRU.

Disclosed is a line replaceable unit (LRU) comprising at least one circuit board, each of the at least one circuit board comprising circuit components mounted thereto, a chassis; a built-in test section; an external connector having a EMI filter; and an internal high intensity radiated field (HIRF) detector. The detector comprises at least one antenna attached to the chassis. Each antenna is configured and dimensioned to pick up an electromagnetic field. The electromagnetic field induces a current in the antenna proportional to a magnitude of the electromagnetic field. The detector also comprises a circuit configured to generate a DC signal based on the induced current in the at least one antenna and a processing section configured to compare the DC signal with a threshold and output a result of the comparison to the built-in test section.

Also disclosed is a high Intensity radiated field (HIRF) detector installed in a line replaceable unit comprising at least one antenna attached to a chassis being configured and dimensioned to pick up an electromagnetic field. The electromagnetic field induces a current in the antenna proportional to a magnitude of the electromagnetic field. The detector also comprises a circuit configured to generate a DC signal based on the induced current in the at least one antenna; and a processing section configured to compare the DC signal with a threshold and output a result of the comparison to a built-in test section.

Also disclosed is a method for testing EMI filter pin connectors of a closed line replaceable unit comprising setting a selecting switch to a Test Connector position, thereby connecting a RF signal generator to a testing connection cable, the testing connection cable being attached to a Test Connector of a line replaceable unit, causing the RF signal generator to generate a test signal as input into the testing connection cable; determining if a detector has detected the test signal. If the test signal is detected, the method further comprises, for each EMI filter pin connector in the line replaceable unit, switching the selecting switch to a corresponding test cable coupled to an EMI filter pin connector, causing the RF signal generator to generate the test signal as input into the corresponding test cable and determining if the detector has detected the test signal, wherein if the test signal is detected, the associated EMI filter pin connector coupled to the test cable is not functioning properly.

BRIEF DESCRIPTION OF THE DRAWINGS

These and other features, benefits, and advantages of the present invention will become apparent by reference to the following figures, with like reference numbers referring to like structures across the views, wherein:

FIGS. 2A and 2B illustrate high level schematics of examples of the Receiving Section in accordance with the invention;

DETAILED DESCRIPTION OF THE INVENTION

Definitions

Line Replaceable Unit (LRU) is a modular component used in the military and commercial industries that is designed to be replaced quickly at a defined location. LRUs are designed to be removed and replaced on the flight line, hence the term "Line" Replaceable Unit.

Figure 1:
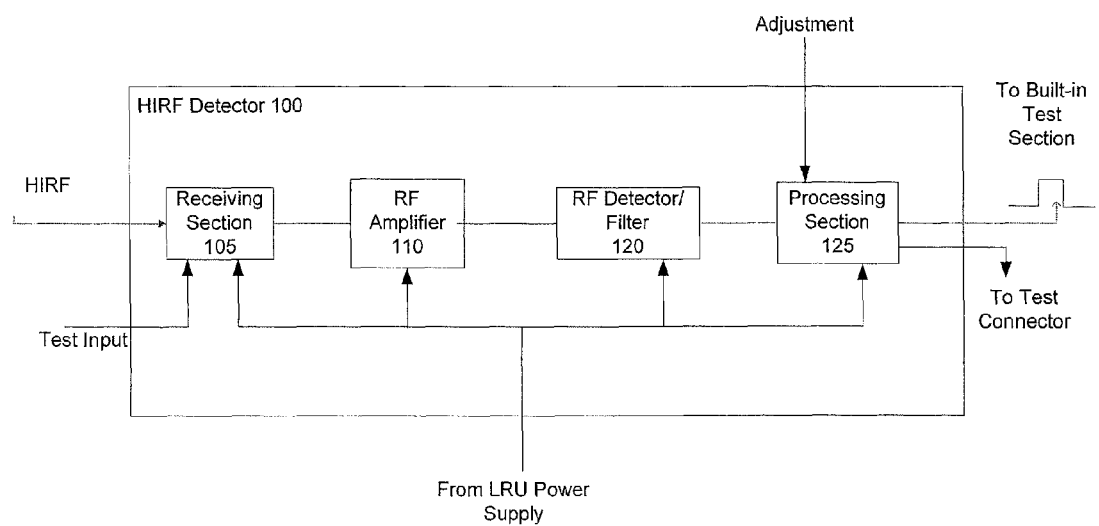
FIG. 1 illustrates a block diagram of an example of an internal detector in accordance with the invention.

FIG. 1 illustrates a block diagram of an internal High Intensity Radiated Fields (HIRF) detector 100. The HIRF environment is applicable to equipment that is subject to extreme electromagnetic environments and/or mission critical equipment whose failure would be hazardous to human safety. As greater dependence is placed upon a vehicle's electrical and electronic systems performing functions required for safe operations, concern has increased for the protection of these systems. Concern for the protection of electrical and electronic systems in aircraft and other vehicles has increased substantially in recent years due to:

Reduction in the electromagnetic shielding afforded by new composite materials.

Increased use of electrical and electronic systems in aircraft for flight/landing systems and in ground vehicles for propulsion and control systems.

Increased susceptibility of systems to HIRF due to increased data bus and processor operating speeds, higher density integrated circuits and cards, and greater sensitivities of electronic equipment.

Expansion of frequency usage above 1 GHz.

Increasing severity of HIRF environment because of an increase in the number of RF transmitters.

HIRF requirements are applied to ensure that the electrical and electronic systems are able to continue safe operation without interruption, failure or malfunction, including those in LRUs.

The internal detector 100 is configured to detect HIRF ("HIRF Detector"). The HIRF Detector 100 includes a Receiving Section 105, a RF Amplifier 110, a RF Detector/Filter 120, and a Processing Section 125. The Receiving Section 105 is coupled to a RF Amplifier 110. The RF Amplifier 110 is coupled the RF Detector/Filter 120. The Processing Section 125 is coupled to RF Detector/Filter 120. The RF Amplifier 110, the RF Detector/Filter 120 and Processing Section 125 are mounted on one or more Printed Wire Boards. In one embodiment, the RF Amplifier 110, the RF Detector/Filter 120 and Processing Section 125 are mounted to the same Printed Wire Board.

The Receiving Section 105 is designed to a predetermined frequency range. For example, the frequency range can be 100 MHz to 1 GHZ. However, the design frequency range can be application specific, e.g., different for different types of LRUs. The Receiving Section 105 will be described in detailed with respect to FIGS. 2A and 2B.

Figure 5A:
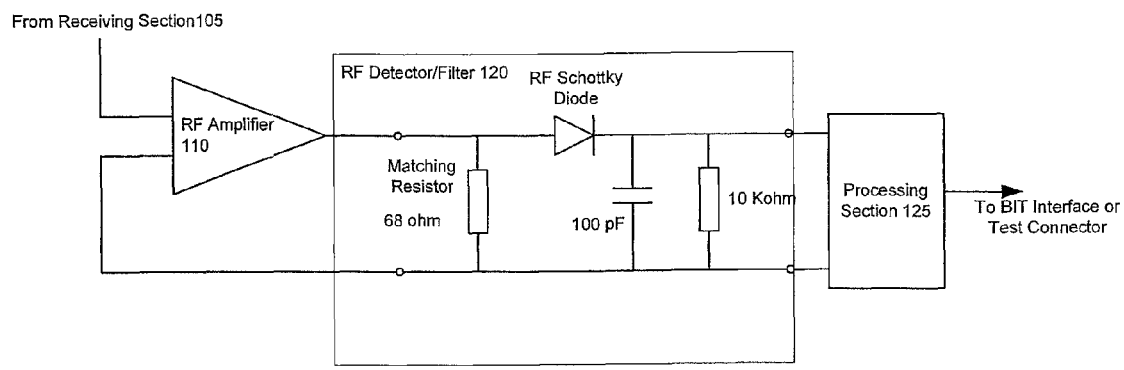
FIG. 5A illustrates a schematic diagram of an example of an internal detector in accordance with the invention.

The gain of the RF Amplifier 110 can be set to account for the ambient noise caused the internal electronic components. Additionally, the gain of the RF Amplifier 110 is determined based upon the preset detection threshold stored in the Processing Section 125. Although, the RF Amplifier 110 is depicted in the diagram (FIG. 1), the RF Amplifier 110 is optional and may not be needed in all applications. The RF Detector/Filter 120 can be a circuit containing a detection diode D1 and a RC filter section as depicted in FIG. 5A.

In an embodiment, the Processing Section 125 can be programmed with two modes: a testing mode and a continuous operation mode. In the testing mode, the Processing Section 125 can output the detection bit to an external device and in the continuous operation mode, the Processing Section 125 outputs the detection bit to the internal built-in test section.

Figure 8:
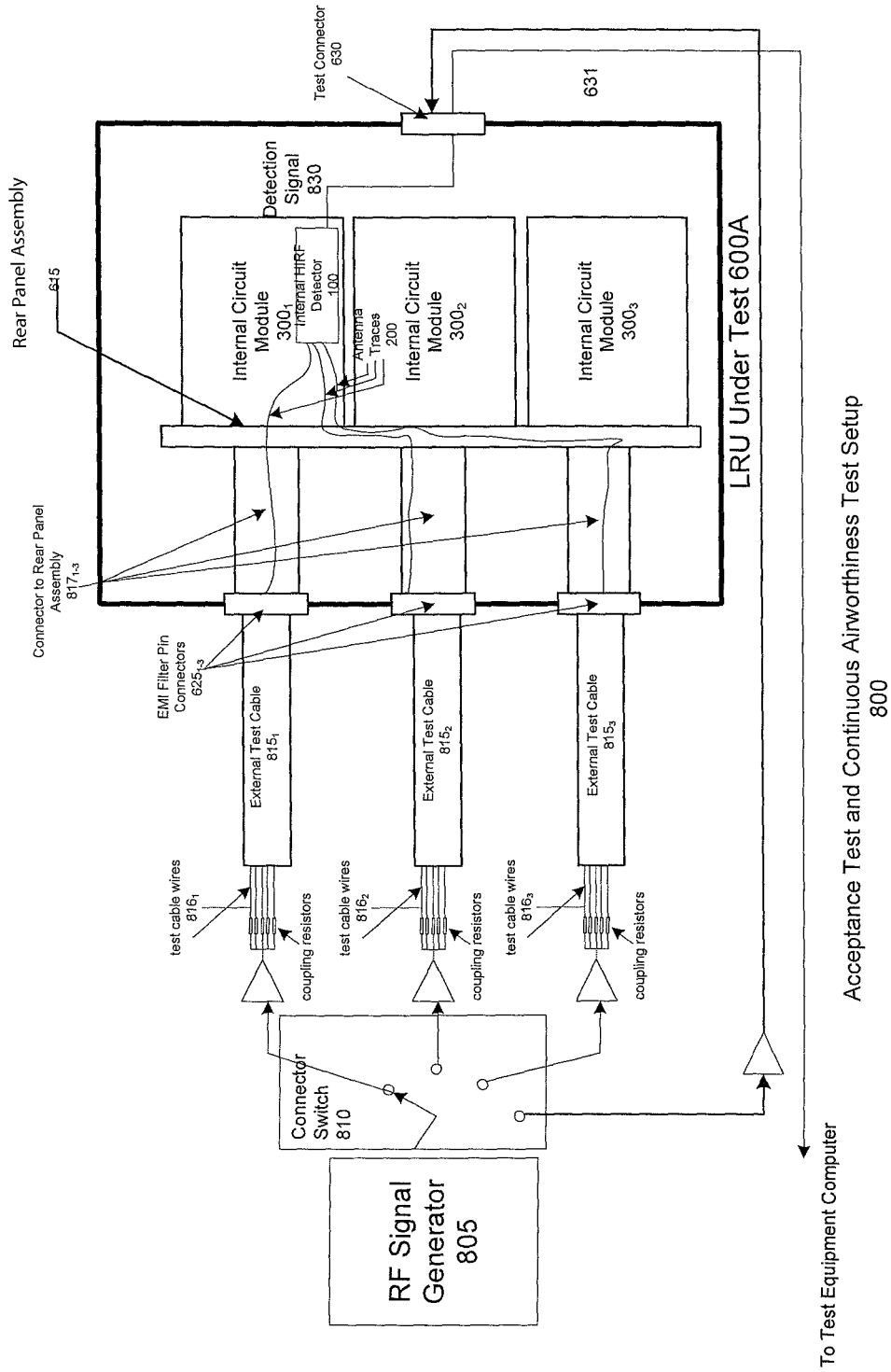
FIG. 8 illustrates a diagram of an example of an acceptance Test and Continuous Airworthiness Testing systems for testing the EMI filter pin connectors for a LRU in accordance with the invention.

FIG. 1 depicts both the test input (test signal in testing mode) and the HIRF signal (continuous operation mode) as inputs to the Receiving Section 105. Additionally, FIG. 1 depicts both the bit detection signal output to the built-in test section (continuous operation mode) and to the Test Connector 630 (as depicted in FIGS. 6C and 8, in testing mode).

The elements of the HIRF Detector 100 can be powered from an LRU power supply, if needed. For example, the RF Amplifier 110 can be biased using the LRU power supply.

Figure 3:
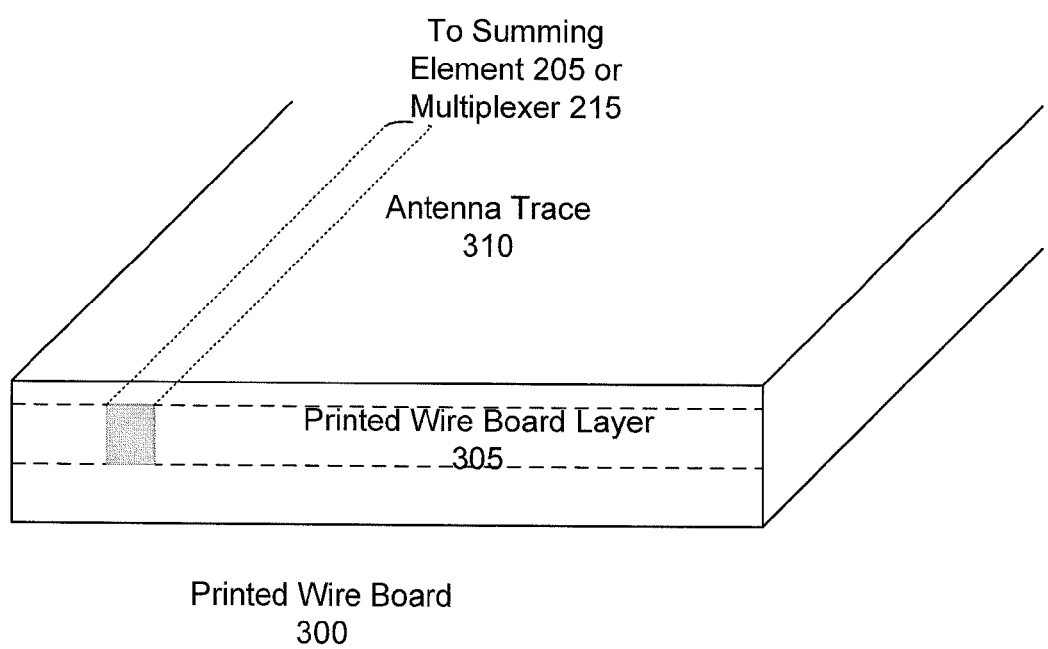
FIG. 3 illustrates an example of a circuit board having the antenna trace according to an embodiment of the invention.

FIG. 2A illustrates an example of a Receiving Section 105A. The Receiving Section 105A comprises the Receiving Elements 200, such as an antenna array, coupling wire(s), antenna traces 310. The Receiving Element(s) 200 can be one or more antenna wires mounted or attached to the chassis, mounted along the chassis walls in a three-dimensional orientation, a circuit trace embedded or etched into a Printed Wire Board Layer 305 of a Printed Wire Board (module) 300 or one or more of the coupling wires between two Printed Wire Boards 300. FIG. 3 illustrates an example of Antenna Trace 310 routed along side of internal wiring from the external connectors to the mother board. One end of the Antenna Trace 310 is coupled to the Summing Element 205 (Receiving Section 105A) or Multiplexer 215 (Receiving Section 105B).

Additionally, if the Receiving Element(s) 200 is an antenna wire mounted to the chassis, a plurality of metallic wires can be used to create a 3-dimensional mapping to generate signals representative of the fields in the x, y, and z directions. The signals are then combined to detect the HIRF.

In an embodiment, antenna traces 310 can be added to each Printed Wire Board 300 of an LRU. Therefore, even if the HIRF field is uneven throughout the inside of the LRU, a HIRF level high enough to cause a LRU response can be detected.

The Receiving Section 105 can be located in proximity to the EMI filter pin connectors 625 (an example of the EMI filter pin connectors are depicted in FIGS. 6C and 8). For example, in an embodiment, the Receiving Section 105 can be an antenna trace 310 embedded in the closest Printed Wire Board 300. Additionally, the Receiving Section 105 can be mounted on the chassis near the EMI filter pin connectors. Alternatively, the Receiving Section 105 can be located in proximity sensitive circuit components to measure the HIRF near the sensitive components such as analog circuits and high gain circuits.

The Receiving Section 105A further comprises a summing element (Σ) 205 for adding the signals received from each of the Receiving Element(s) 200 and a Buffer 210 for buffering the added signals. The Receiving Section 105A output an added signal to the RF Amplifier 110.

FIG. 2B illustrates an example of another Receiving Section 105B. The Receiving Section 105B comprises the same Receiving Elements 200, however, instead of adding all of the received signals, the received signals are selected one at a time by a Multiplexer 215. Each selected signal is successively buffered by Buffer 210. The Multiplexer 215 repeatedly outputs one selected signal at a time to the Buffer 210. Each signal received from the Receiving Elements 200 is selective output for each cycle. The Receiving Section 105B outputs the currently selected signal to the RF Amplifier 110. Receiving Section 105B allows for each signal to be examined by the Processing Section 125.

Figure 4:
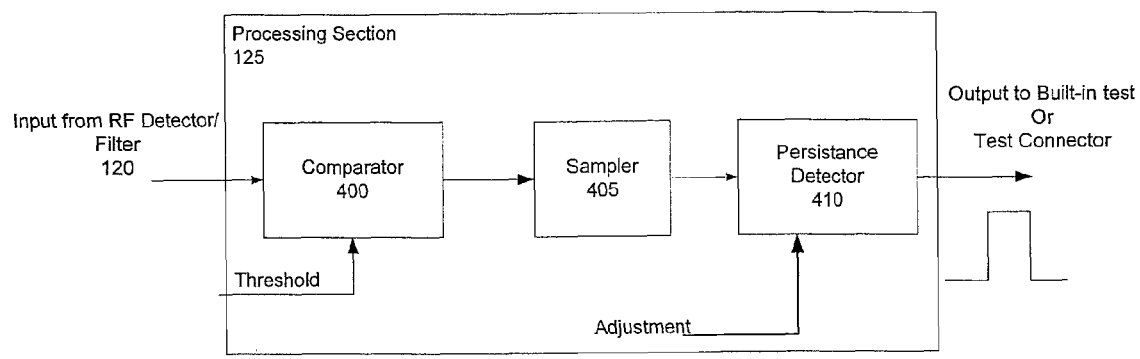
FIG. 4 illustrates a block diagram of the Processing Section in accordance with the invention.

FIG. 4 illustrates a block diagram depicting an example of the Processing Section 125. In the example of the Processing Section 125 depicted in FIG. 4, the Processing Section 125 comprises a Comparator 400, a Sampler 405 and a Persistence Detector 410. In an embodiment, the Processing Section 125 includes a storage device (not shown) for storing at least one detection threshold. Since each LRU reacts differently to a HIRF, the detection threshold varies based on the type of LRU and the electronic components mounted to the print wire boards 300. Therefore the detection threshold can be application specific. The detection threshold also can be remotely adjusted after assembly, as necessary. In this embodiment, the storage device may also include a threshold adjustment for performing the functionality described herein.

The Processing Section 125 receives the output of the RF Detector/Filter 120 (showing in FIG. 4 as input) and the Comparator 400 compares this input with the detection threshold. If the received output is higher than the detection threshold, the Comparator 400 outputs a signal indicating a positive detection to the Sampler 405. For example, the Comparator 400 can output a "high" signal value. If the input is less than the detection threshold, the Comparator 400 outputs a signal indicating a negative detection to the Sampler 405. For example, the Comparator 400 can output a "low" signal value.

The Sampler 405 periodically samples the output of the Comparator 400. The sample rate is preset. The sample rate can be every 30 seconds. However, the sample rate can be application specific. Furthermore, in an embodiment, the sample rate can be remotely adjusted after assembly, as necessary. In this embodiment, the storage device (not shown) may also include a sample rate adjustment for performing the functionality described herein. If the Sampler 405 receives a positive detection signal during the sample period, e.g., a "high" signal, the Sampler 405 outputs a positive detection signal to the Persistence Detector 410. If the Sampler 405 receives a negative detection signal during the sample period, e.g., a "low" signal, the Sampler 405 outputs a negative detection signal to the Persistence Detector 410.

The Persistence Detector 410 is configured to determine if the positive detection signal received from the Sampler 405 occurs for a period of time where the HIRF signal can cause damage. In an embodiment, the Persistence Detector 410 counts the number of consecutive positive detection signals received from the Sampler 405 and compares the counted number with a threshold. If the counted number is greater than the threshold, the Persistence Detector 410 outputs a positive detection bit to the built-in test section (in continuous operation mode) or to the Test Connector 630 (in testing mode). The built-in test section can be mounted on the same Printed Wire Board 300. In another embodiment, the Persistence Detector 410 counts the number of positive detection signals received from the Sampler 405 within a preset period of time. If the counted number is greater than the threshold, the Persistence Detector 410 outputs a positive detection bit to the built-in test section or the Test Connector 630. In another embodiment, the Persistence Detector 410 tracks the number of positive detection signals received in a period of time and the number of negative detection signals received within the same period of time. The Persistence Detector 410 separately adds the number of positive detection signals and the negative detection signals and then subtracts the total number of negative detection signals from the total number of positive detection signals to obtain a net positive detection value. If the net positive detection value is greater than the threshold, the Persistence Detector 410 outputs a positive detection bit to the built-in test section (or the Test Connector 630).

While FIG. 4 depicts the Comparator 400, Sampler 405 and the Persistence Detector 410 separately, these components can be integrated into a single processor. The processor can be a microprocessor or a CPU. Additionally, the functionality of the Comparator 400, Sampler 405 and persistence detection 410 can be implemented using a PAL, PAL, FPGA or an ASIC.

The Processing Section 125 is powered from the LRU Power Supply (not shown).

The HIRF Detector 100 can be used during initial testing, such as acceptance testing, during continuous operation and during maintenance procedure such as continued airworthiness (CAW) tests.

Figure 5B:
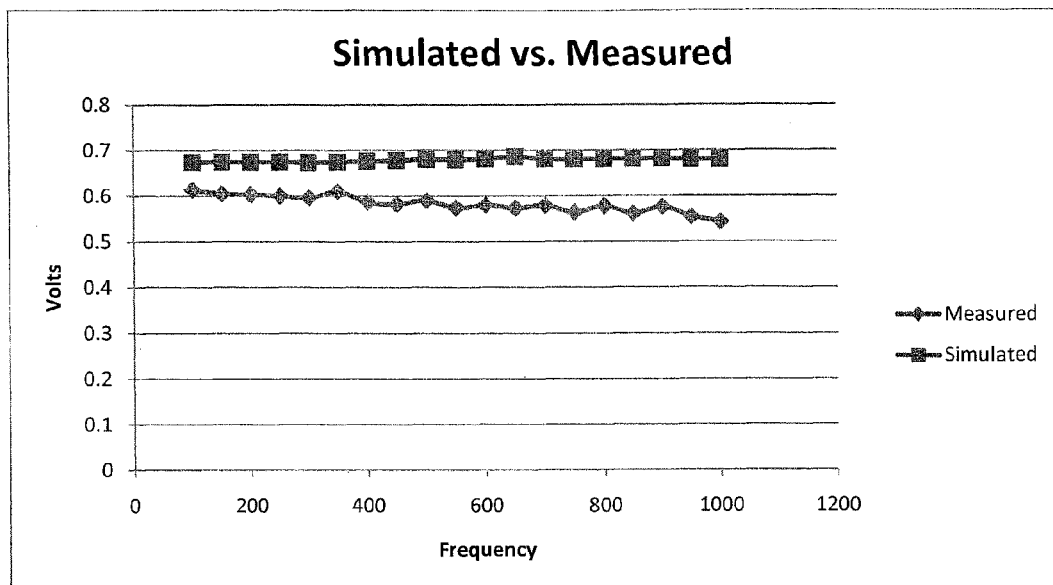
FIG. 5B illustrates test results for the example internal detector depicted in FIG. 5A.

FIG. 5A illustrates a schematic diagram of an example of HIRF Detector 100. FIG. 5B depicts simulated and measured test results for this detector. A signal having a known signal strength was input. The output voltage was measured using a voltmeter. The simulated results substantially correlate with the measure voltages. As can be seen from FIG. 5B, the frequency response for the detector is relatively flat over measured frequency range.

Figure 6A:
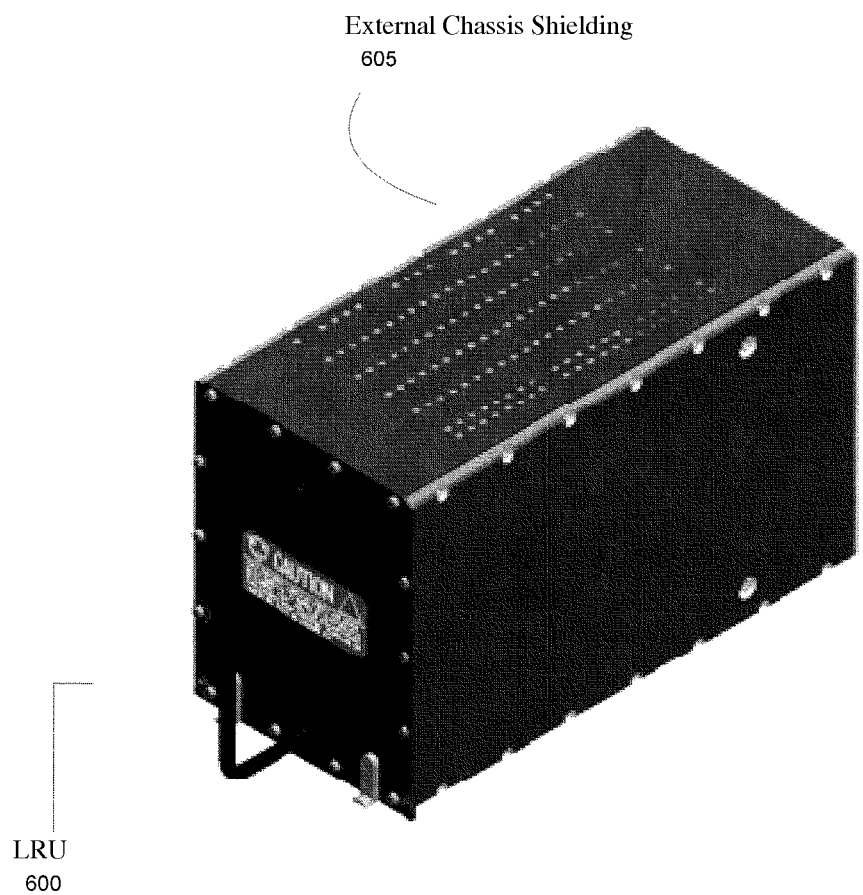
FIG. 6A illustrate an external view of LRU.
Figure 6B:
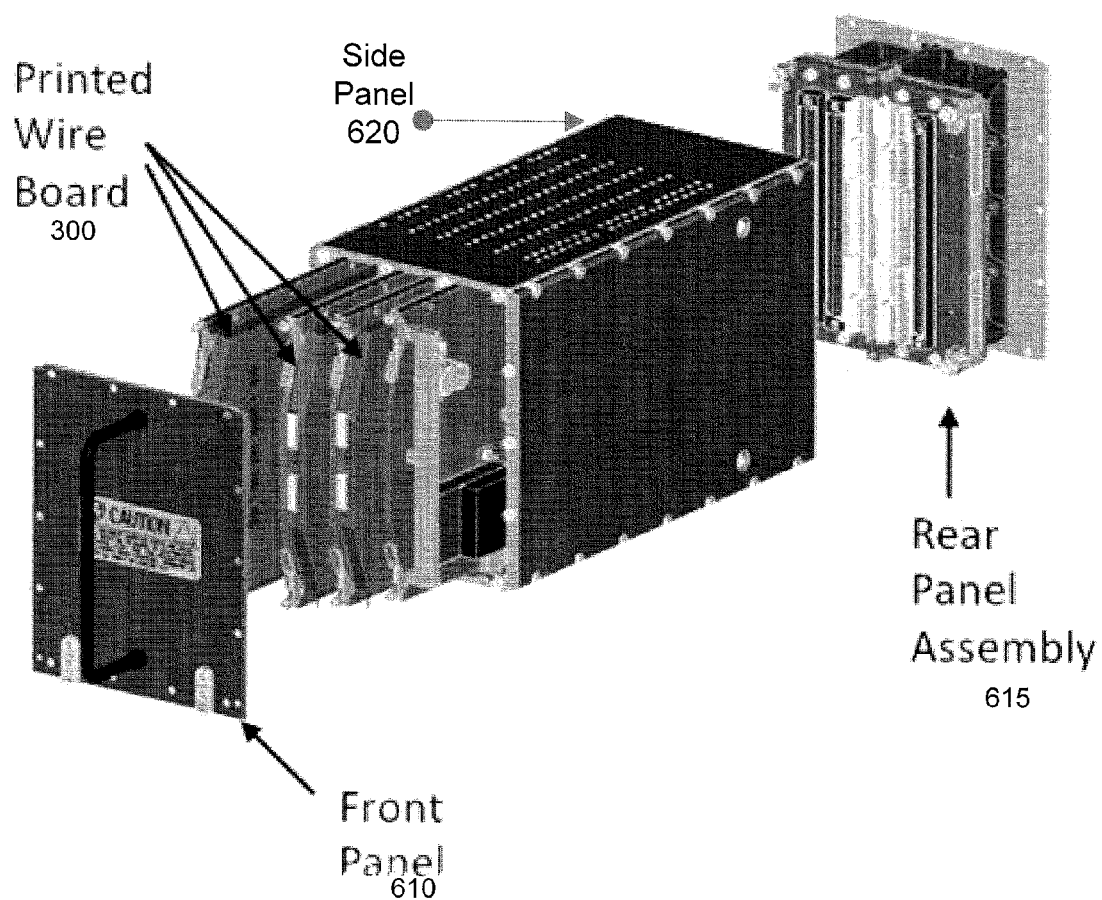
FIG. 6B illustrates an explode view of an LRU and FIG. 6C illustrate an external view of the LRU showing EMI filter pin connector slots and a Test Connector.
Figure 6C:
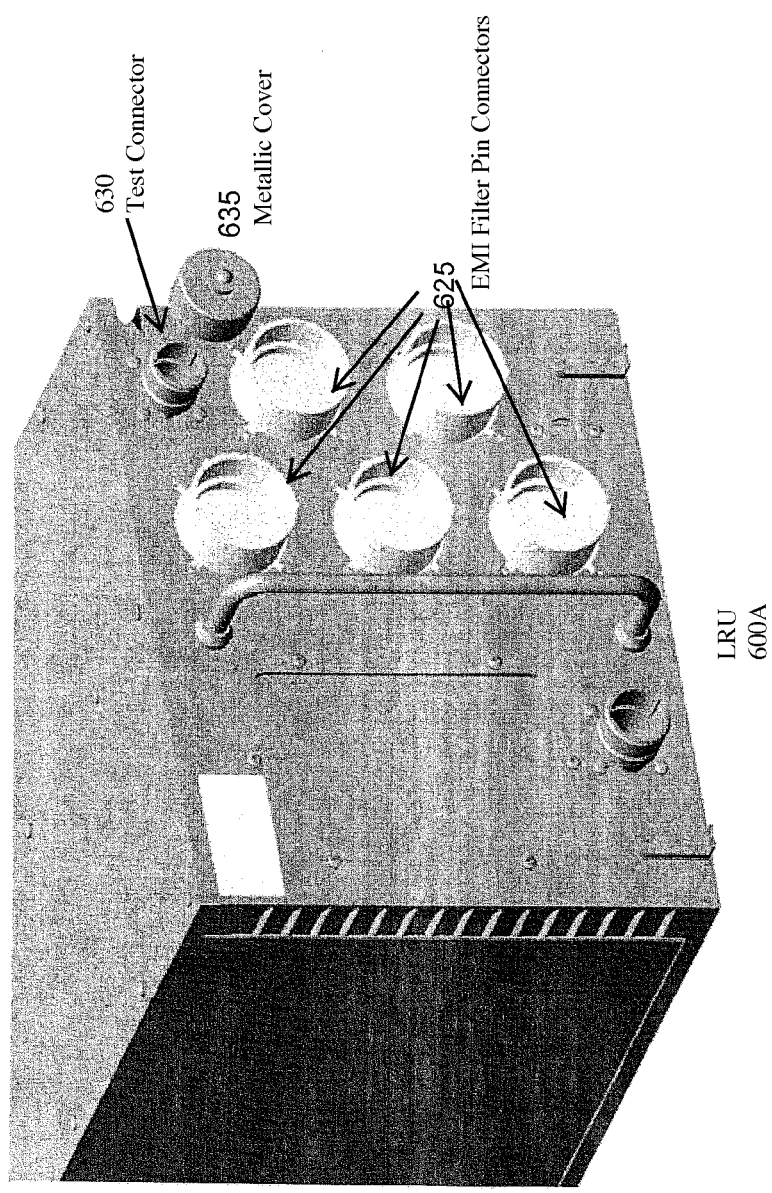

FIG. 6A illustrates an external view of an example of an LRU 600. FIG. 6A depicts the external chassis shielding 605. FIG. 6B illustrates an external exploded view of the same LRU 600. The external view illustrates multiple Printed Wire Boards 300. The front panel 610 and rear panel assembly 615 and the side panels 620 form a housing for the Printed Wire Boards 300. The front panel 610, rear panel assembly 615, and side panels 620 collectively form the chassis shielding 605. The Printed Wire Boards 300 attached to slots in the rear panel assembly 615.

FIG. 6C illustrates an external view of the rear panel of a second example of an LRU 600A. The rear panel comprises a plurality of EMI filter pin connectors 625 and a Test Connector 630. During testing, the Test Connector 630 is covered with a metallic cover 635.

The HIRF Detector 100 is sensitive to higher than normal intruding EMI fields from external sources. Each LRU 600 also includes a built-in test section (not shown).

Each Printed Wire Board 300 has electronic component mounted thereto. These electronic components are configured to perform the functionality of the LRU, e.g., LRU 600. Additionally, according to certain aspects of the invention, one or more of the Printed Wire Boards 300 also includes electronic components that are dedicated to detect HIRF and output a signal to a built-in test section. If a HIRF is detected, there is a high likelihood that either one of the EMI filter pin connectors 625 and/or the chassis shielding 605 have failed. The HIRF Detector 100 provides a closed-box testing.

A typical LRU, e.g., LRU 600, is tested using an extensive qualification and acceptance testing that exposes the units and a model of their interconnections cabling to high amounts of electromagnetic energy (RF energy), representative of a real world exposures that the units can and will be exposed during service. The tests use various test equipment to evaluate the levels of energy and the response of the unit.

The test implements an Acceptance Test Procedure (ATP)/Continuous Airworthiness Procedure. The tests are required to be performed with the LRUs 600 closed and in a ready-for-delivery configuration. The HIRF Detector 100 is used to determine the integrity of the LRU 600 related to an exposure of the RF energy.

Figure 7:
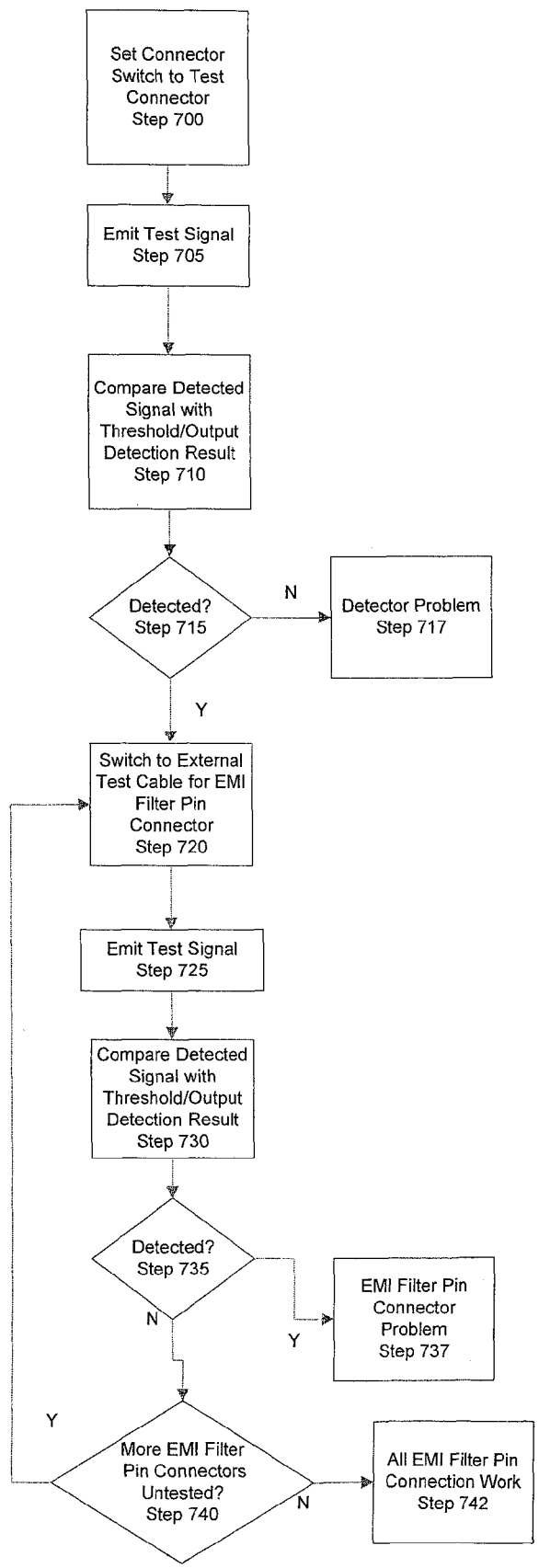
FIG. 7 illustrates a flow chart for a method of testing the EMI filter pin connectors and chassis shielding during acceptance testing.

FIGS. 7 and 8 illustrate the testing procedure and test setup, respectively.

The test setup 800 comprises an external test RF Signal Generator 805, a Connector Switch 810, a plurality of External Test Cables $815_N$ and a Test Connector 630. The Connector Switch 810 comprises a plurality of switching positions and will selectively couple the test signal generated by the RF Signal Generator 805 to each of the External Test Cable 815 and the Test Connector 630 via the connector testing cable 631. As depicted in FIG. 8, the Connector Switch 810 has four switch positions (illustrates by the dots). Three of the switching positions are used to couple the three External Test Cables 815 (three EMI filter pin connectors $625_N$) to the RF Signal Generator 805. One of the switching positions is used to couple the Test Connector 630 to the RF Signal Generator 805. The Connector Switch 810 will need to have one more switching position than the number of EMI filter pin connectors $625_N$. Each EMI filter pin connector 625 has a corresponding External Test Cable 815 coupled to it. As depicted, there are three EMI filter pin connectors $625_{1-3}$ and three external test cables $815_{1-3}$. FIG. 8 illustrates a portion of the External Test Cable being exposed to show the internal test cable wires and the coupling resistors (test cable wires 816). The External Test Cables $815_{1-3}$ have LRU connectors at one end and at the other end each wire in the cable is terminated in a coupling resistor. The other terminal of each of the isolation resistors associated with a given cable is connected together and connected to the output amplifier. Each external test cable 815 is similarly fitted.

The Test Connector 630 is coupled to the internal HIRF Detector 100. The Test Connector 630 is not fitted with EMI filters. When not in use, the area where the Test Connector 630 is located is capped with the metallic cover 635 for EMI shielding. The Test Connector 630 is capped during testing to present the test frequency signal being leaked into the LRU, e.g., 600A.

The output of the internal HIRF Detector 100 is sent to a test equipment computer (the computer is not shown in FIG. 8). However, the output of the internal HIRF Detector 100 is illustrated as Detection Signal 830.

As depicted in FIG. 8, the LRU under test, e.g., LRU 600A, comprises three internal circuit modules (wire boards $300_{1-3}$), three EMI filter pin connectors $625_{1-3}$ and a rear panel assembly 615. The EMI filter pin connectors $625_{1-3}$ are coupled to the rear panel assembly 615 via cables $817_{1-3}$.

FIG. 7 illustrates a flow chart of an example of a testing method. The testing method will be described in conjunction with the test setup depicted in FIG. 8. However, the testing method is not limited to the test setup 800 depicted in FIG. 8 and can be conducted using other testing setups.

At step 700, the Connector Switch 810 is set to the Test Connector 630, which couples the RF Signal Generator 805 to the Test Connector 630. At step 705, the LRU, e.g., 600A having the internal HIRF Detector 100 is excited with the test frequency signal the internal HIRF Detector can be one or more of the Internal Circuit Modules $300_{1-3}$ (Printed Wire Board). The power level of the test frequency signal is predetermined and controlled. The RF Signal Generator 805 is set to the predetermined frequency and amplitude for the Test Connector input. At step 710, the Processing Section 125 compares the output of RF Filter/Detector 120 with the preset threshold. The Processing Section 125 compares a digital value of the test frequency signal with the preset threshold. The digital value is generated from the received test frequency signal. The HIRF Detector 100 should indicate that HIRF has been detected. At step 715, a determination is made if the HIRF Detector 100 detected the HIRF by evaluating the Detection Signal 830 on the test equipment computer. If the HIRF Detector 100 detected the HIRF, then the testing proceeds ("Y" at step 715). This test validates that the HIRF Detector 100 functions properly.

At step 720, the Connector Switch 810 is set to one of the External Test Cables, e.g., $815_1$, which couples the RF Signal Generator 805 to the external test cables $815_1$. For each external test cable 815, the LRU with the internal HIRF Detector 100 is excited with the test frequency signal at step 725. At step 730, the Processing Section 125 compares the output of RF Filter/Detector 120 with the preset threshold. At step 730, the Processing Section 125 outputs the Detection Signal 830. At step 735, a determination is made if the HIRF Detector 100 detected the HIRF by evaluating the Detection Signal 830 on the test equipment computer. If all of the EMI filter pin connectors 625 are functioning properly no response from the HIRF Detector 100 is expected ("N" at step 735). If the HIRF Detector 100 registers a HIRF intrusion, the EMI filter pin connector 625 is faulty ("Y" at step 735) and must be replaced or repaired (step 737).

Steps 720-735 are repeated for each EMI filter pin connection 625. After step 735, a determination is made if there are any untested EMI filter pin connectors 625 (step 740). If there are untested EMI filter pin connectors ("Y" at step 440), the process returns to step 720. If not, ("N" at step 740), the process is done and all of the EMI filter pin connectors 625 are functioning properly (step 742).

If at step 715, the test signal is not detected by the HIRF Detector 100, the HIRF Detector 100 is faulty ("N" at step 715) and should be examined for further evaluation (step 717).

Various aspects of the present disclosure may be embodied as a program, software, or computer instructions embodied or stored in a computer or machine usable or readable medium, which causes the computer or machine to perform the method when executed on the computer, processor, and/or machine. A computer readable medium, tangibly embodying a program of instructions executable by the machine to perform various functionalities and methods described in the present disclosure is also provided.

The computer readable medium could be a computer readable storage medium or a computer readable signal medium. Regarding a computer readable storage medium, it may be, for example, a magnetic, optical, electronic, electromagnetic, infrared, or semiconductor system, apparatus, or device, or any suitable combination of the foregoing; however, the computer readable storage medium is not limited to these examples. Additional particular examples of the computer readable storage medium can include: a portable computer diskette, a hard disk, a magnetic storage device, a portable compact disc read-only memory (CD-ROM), a random access memory (RAM), a read-only memory (ROM), an erasable programmable read-only memory (EPROM or Flash memory), an electrical connection having one or more wires, an optical fiber, an optical storage device, or any appropriate combination of the foregoing; however, the computer readable storage medium is also not limited to these examples. Any tangible medium that can contain, or store a program for use by or in connection with an instruction execution system, apparatus, or device could be a computer readable storage medium.

The computer instructions may be provided to a processor of a general purpose computer, special purpose computer, or other programmable data processing apparatus to produce a machine, such that the instructions, which execute via the processor of the computer or other programmable data processing apparatus, create means, devices, units, or sections for implementing the functionality specified.

The Detector may be any type of known or will be known systems such as, but not limited to, a virtual computer system and may typically include a processor, memory device, a storage device, input/output devices, internal buses, and/or a communications interface for communicating with other computer systems in conjunction with communication hardware and software, etc.

The terms "element", "interface" "section", "device" or "unit" as may be used in the present disclosure may include a variety of combinations of fixed and/or portable computer hardware, software, peripherals, and storage devices. The Detector or system may include a plurality of individual components that are networked or otherwise linked to perform collaboratively, or may include one or more stand-alone components.

The function(s) described herein may occur out of the order noted in the figures or text including in the reverse order or concurrently (or substantially concurrently) depending upon the functionality involved.

The embodiments described above are illustrative examples and it should not be construed that the present invention is limited to these particular embodiments. Thus, various changes and modifications may be effected by one skilled in the art without departing from the spirit or scope of the invention as defined in the appended claims.

What is claimed is:

1. A line replaceable unit (LRU) comprising:
   at least one circuit board, each of said at least one circuit board comprising circuit components mounted thereto;
   a chassis comprising three orthogonal sides;
   a built-in test section;
   an external connector having an electromagnetic interference EMI filter; and
   an internal high intensity radiated field (HIRF) detector, said HIRF detector comprising:
     a plurality of antenna, where an antenna of the plurality of antennas is attached to each of the three orthogonal sides, the plurality of antennas being configured and dimensioned to pick up an electromagnetic field having a frequency range of 100 MHz to 1 GHz, the electromagnetic field inducing a current in at least one of the plurality of antennas proportional to a magnitude of the electromagnetic field;
     a multiplexer configured to select the induced current on one antenna from among the plurality of antennas for further processing;
     a circuit configured to generate a DC signal based on the selected induced current; and
     a processing section configured to compare the DC signal with a threshold and output a result of the comparison to the built-in test section.

2. The line replaceable unit (LRU) according to claim 1, wherein the threshold is adjustable.

3. The line replaceable unit (LRU) according to claim 1, wherein the processing section is mounted to one of the at least one circuit boards.

4. The line replaceable unit (LRU) according to claim 1, wherein the threshold is adjustable based at least upon a type of LRU and a type of the circuit components mounted on the at least one circuit board.

5. The line replaceable unit (LRU) according to claim 1, wherein the multiplexer repeats the selection of the induced current on an antenna from among the plurality of antennas until all of the induced currents has been selected.

6. A line replaceable unit (LRU) comprising:
   at least one circuit board, each of said at least one circuit board comprising circuit components mounted thereto;
   a chassis comprising three orthogonal sides;
   a built-in test section;
   an external connector having a EMI filter; and
   an internal high intensity radiated field (HIRF) detector, said HIRF detector comprising:
     a plurality of antenna, where an antenna of the plurality of antennas is attached to each of the three orthogonal sides, the plurality of antennas being configured and dimensioned to pick up an electromagnetic field having a frequency range of 100 MHz to 1 GHz, the electromagnetic field inducing a current in at least one of the plurality of antennas proportional to a magnitude of the electromagnetic field;
     an adder configured to add the induced current from each of the at least one of the plurality of antennas;
     a circuit configured to generate a DC signal based on the added induced current; and
     a processing section configured to compare the DC signal with a threshold and output a result of the comparison to the built-in test section.

7. The line replaceable unit (LRU) according to claim 6, wherein the threshold is adjustable.

8. The line replaceable unit (LRU) according to claim 6, wherein the processing section is mounted to one of the at least one circuit boards.

9. The line replaceable unit (LRU) according to claim 6, wherein the threshold is adjustable based at least upon a type of LRU and a type of the circuit components mounted on the at least one circuit board.

10. A high intensity radiated field (HIRF) detector configured to be installed in a line replaceable unit having at least one circuit board with circuit components mounted thereto, the HIRF detector comprising:
    at least one antenna attached to a chassis, the at least one antenna being configured and dimensioned to pick up an electromagnetic field having a frequency range of 100 MHz to 1 GHz, the electromagnetic field inducing a current in the at least one antenna proportional to a magnitude of the electromagnetic field;
    a circuit configured to generate a DC signal based on the induced current in the at least one antenna; and
    a processing section configured to compare the DC signal with a threshold and output a result of the comparison to a built-in test section in the line replaceable unit, the processing section comprising:
      a sampler configured to sample the result of the comparison at a sample rate; and
      a persistence detector configured to evaluate the sampled result and output a signal indicative of the evaluation to the built-in test section of the line replaceable unit.

11. The HIRF detector of claim 10, further comprising:
    an amplifier having a gain for amplifying the induced current.

12. The HIRF detector of claim 10, wherein the persistence detector is configured to count a number of consecutive times the sampled result is a first level and compare the counted number of consecutive times with a second threshold, wherein the persistence detector is configured to output a positive indication if the counted number of consecutive times is larger than the second threshold.

13. The HIRF detector of claim 10, wherein the persistence detector is configured to count a number of times the sampled result is a first level within a preset period of time and compare the counted number of times with a third threshold, wherein the persistence detector is configured to output a positive indication if the counted number of times is larger than the third threshold.

14. The HIRF detector of claim 10, wherein the persistence detector is configured to count a number of times the sampled result is a first level, count a number of times the sampled result is a second level, subtract the counted number of times the sampled result is a second level from the counted number of times the sampled result is a first level to generate a subtracted value and compare the subtracted value with a fourth threshold, wherein the persistence detector is configured to output a positive indication if the subtracted value is larger than the fourth threshold.

15. The HIRF detector of claim 10, wherein the sample rate is remotely adjustable.

\* \* \* \* \*